(12) United States Patent
Zhuang et al.

(10) Patent No.: US 7,041,551 B2
(45) Date of Patent: May 9, 2006

(54) DEVICE AND A METHOD FOR FORMING A CAPACITOR DEVICE

(75) Inventors: Haoren Zhuang, Wallkill, NY (US); Nicolas Nagel, Kanagawa-ken (JP); Jenny Lian, Wallkill, NY (US); Rainer Bruchhaus, Kanagawa-ken (JP)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/677,099

(22) Filed: Sep. 30, 2003

(65) Prior Publication Data

US 2005/0067644 A1    Mar. 31, 2005

(51) Int. Cl.
 *H01L 21/8242*   (2006.01)
(52) U.S. Cl. .................. 438/239; 438/253; 438/396
(58) Field of Classification Search .............. 438/3, 438/238–242, 396, 210, 253, 329, 387
See application file for complete search history.

(56) References Cited

U.S. PATENT DOCUMENTS

| | | |
|---|---|---|
| 6,198,652 B1 | 3/2001 | Kawakubo et al. |
| 6,259,125 B1 * | 7/2001 | Fazan et al. ................. 257/298 |
| 6,300,652 B1 | 10/2001 | Risch et al. |
| 6,448,597 B1 | 9/2002 | Kasai et al. |
| 6,699,725 B1 * | 3/2004 | Lee ................................ 438/3 |
| 2002/0081790 A1 | 6/2002 | Honigschmid et al. |
| 2003/0058700 A1 | 3/2003 | Bruchhaus et al. |

FOREIGN PATENT DOCUMENTS

| | | |
|---|---|---|
| DE | 101 31 624 | 1/2003 |
| DE | 101 31 626 | 1/2003 |

\* cited by examiner

*Primary Examiner*—David Nelms
*Assistant Examiner*—Quoc Hoang
(74) *Attorney, Agent, or Firm*—Fish & Richardson P.C.

(57) ABSTRACT

A device and method for forming a capacitor device comprises forming a substrate, forming a first interlayer dielectric layer on the substrate and forming two or more contact plugs through the substrate. A conducting layer is formed on the first interlayer dielectric layer and an electrode is formed on alternate ones of the contact plugs by etching the conducting layer. The etched electrodes are then coated with a ferroelectric layer. The ferroelectric layer is etched from the surfaces separating the contact plugs and additional electrodes are created by filling the spaces between the electrodes on alternate ones of the contact plugs with a conductive material to establish electrical contact between the plugs and the electrodes.

24 Claims, 7 Drawing Sheets

Before Capacitor Process

FIG 6

PZT Etch Back

DEVICE AND A METHOD FOR FORMING A CAPACITOR DEVICE

FIELD OF THE INVENTION

The present invention relates to a device and a method for forming a capacitor device, such as an FeRAM.

BACKGROUND OF THE INVENTION

Many conventional FeRAM devices include a horizontal ferrocapacitor structure in which a stack of layers is formed including top and bottom electrodes sandwiching a ferroelectric layer. An alternative vertical capacitor structure was suggested in U.S. Pat. No. 6,300,652 the disclosure of which is incorporated herein by reference. A vertical capacitor includes a ferroelectric element sandwiched between electrodes all at substantially the same level in the FeRAM device.

Figure 1:
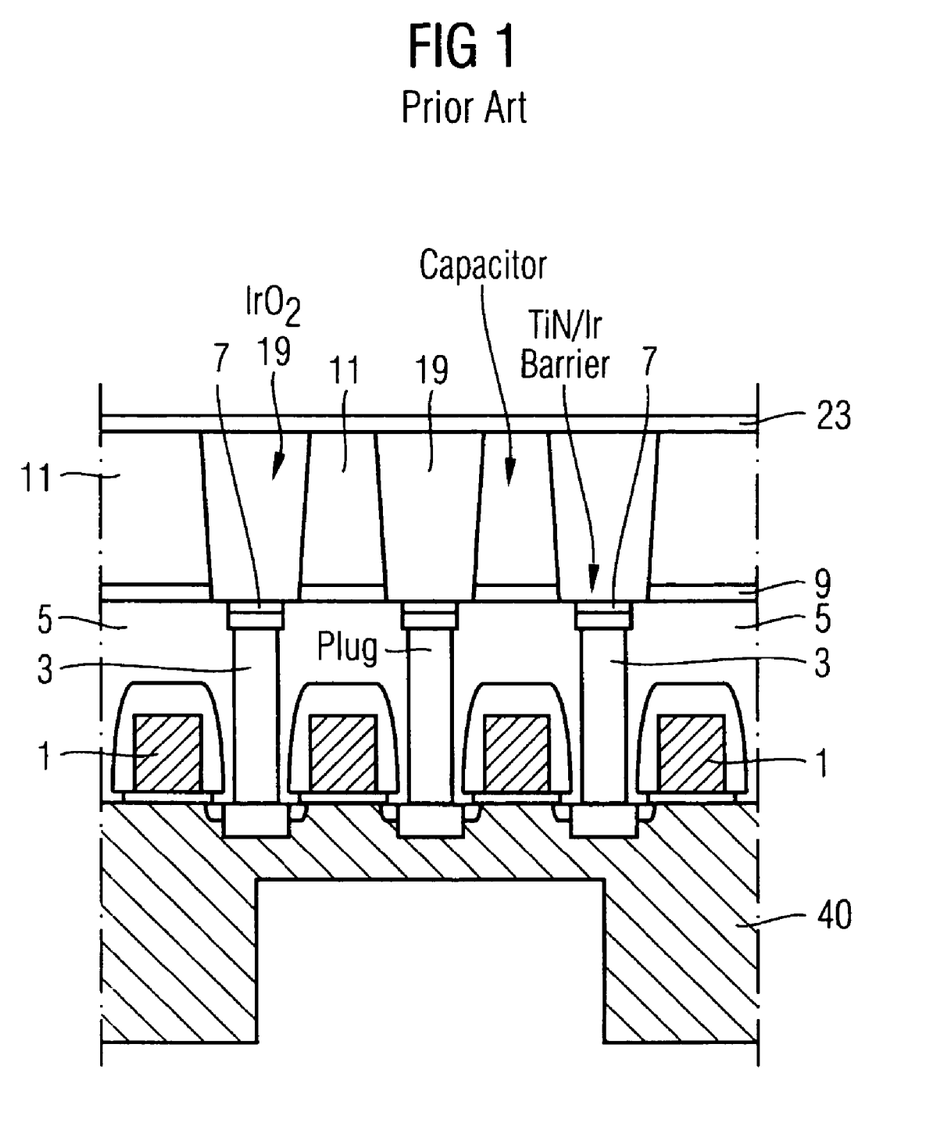
FIG. 1 is a schematic cross-section through a first conventional vertical capacitor.

The structure of a conventional vertical capacitor is shown in FIG. 1. The vertical capacitors are typically formed over a substructure, which may for example be of the form shown in FIG. 1 in which various electronic components 1 are connected to conductive plugs 3 which extend upwards through an interlayer dielectric layer such as a matrix 5 of, for example TEOS (tetraethylorthosilicate). The upper ends of the plugs 3 terminate in titanium nitride/iridium barrier elements 7 having a top surface flush with the surface of the matrix 5.

An insulating layer 9 of aluminium oxide is formed over the surface of the matrix 5 and a thicker layer of ferroelectric material 11 such as PZT ($PbZrTiO_3$) is formed over the insulating layer 9.

Hard mask elements are deposited over selected areas of the PZT layer 11 and the portions of the PZT 11 and the aluminium oxide 9 which are not protected by the hard mask elements are etched all the way through forming openings.

The openings are then filled with conductive material 19 such as iridium oxide ($IrO_2$) by depositing iridium oxide over the entire structure and chemical mechanical planarization polishing (CMP) is performed to form a flat upper surface which is partly PZT 11 and partly the conductive material 19. Then an aluminium oxide layer 23 is formed over the surface. The elements 19 of conductive material constitute electrodes whilst the remaining PZT 11 forms the dielectric.

The vertical capacitor structure has advantages in that it reduces the cell size and is easy to connect. The main difficulties are in reducing the height of the capacitors and etching the ferroelectric layers vertically, both of which make it difficult to reduce the size of the cell and achieve a high aspect ratio for the capacitor.

In view of the foregoing problems with conventional processes and devices, a need exists for an easily applied method for producing capacitors with a high aspect ratio and enabling etching of ferroelectric layers vertically, without reducing production yield or compromising performance.

SUMMARY OF THE INVENTION

In general, the invention comprises a method for compensating for the slope of the faces of electrodes produced by etching. The method in broad terms is to produce alternate electrodes by etching and intermediate electrodes by coating the etched electrodes with a ferroelectric layer such as PZT, and filling the residual spaces with conducting material to provide electrodes with complementary slopes.

The method according to embodiments of the present invention is a very simple back-end process. Also, as only alternate electrodes are produced by etching, there is more space available for the etching process. This is particularly advantageous in systems where it is required to make very small cells and provide a high aspect ratio.

According to a first aspect of the present invention there is provided a method for forming a capacitor device comprising the steps of:
 forming a substrate;
 forming a first interlayer dielectric layer on said substrate;
 forming two or more contact plugs through said substrate, said plugs being separated from one another by a surface;
 forming a conducting layer on said first interlayer dielectric layer;
 producing an electrode on alternate ones of said two or more contact plugs by etching said conducting layer;
 coating said electrodes with a ferroelectric layer;
 etching said ferroelectric layer from said surfaces separating said contact plugs; and
 creating additional electrodes by filling spaces between said electrodes on alternate ones of said contact plugs with a conductive material to establish electrical contact between the plugs and the electrodes.

According to a second aspect of the present invention there is provided a ferroelectric capacitor device formed according to the above-defined method.

According to a third aspect of the present invention there is provided an FeRAM device formed according to the above-defined method.

According to a fourth aspect of the present invention there is provided a device comprising:
 a substrate;
 a first interlayer dielectric layer formed on said substrate;
 two or more contact plugs through said substrate, said plugs being separated from one another by a surface;
 a conducting layer formed on said first interlayer dielectric layer;
 an electrode formed on alternate ones of said two or more contact plugs by etching said conducting layer;
 a ferroelectric layer coating said electrodes; and
 a conductive filler material deposited in spaces between said electrodes on alternate ones of said contact plugs to create additional electrodes.

According to a fifth aspect of the present invention there is provided a ferroelectric capacitor device comprising the above-defined device.

According to a sixth aspect of the present invention there is provided an FeRAM device comprising the above-defined device.

BRIEF DESCRIPTION OF THE DRAWINGS

Preferred features of the invention will now be described, for the sake of illustration only, with reference to the following Figures in which.

DETAILED DESCRIPTION OF PREFERRED EMBODIMENTS

The method and device which illustrate an embodiment of the present invention will be explained with reference to FIGS. 2 to 7. The elements of the capacitor structure illustrated in FIGS. 2 to 7 which correspond exactly to elements in the capacitor structures shown in FIG. 1 are allotted the same reference numerals.

Figure 2:
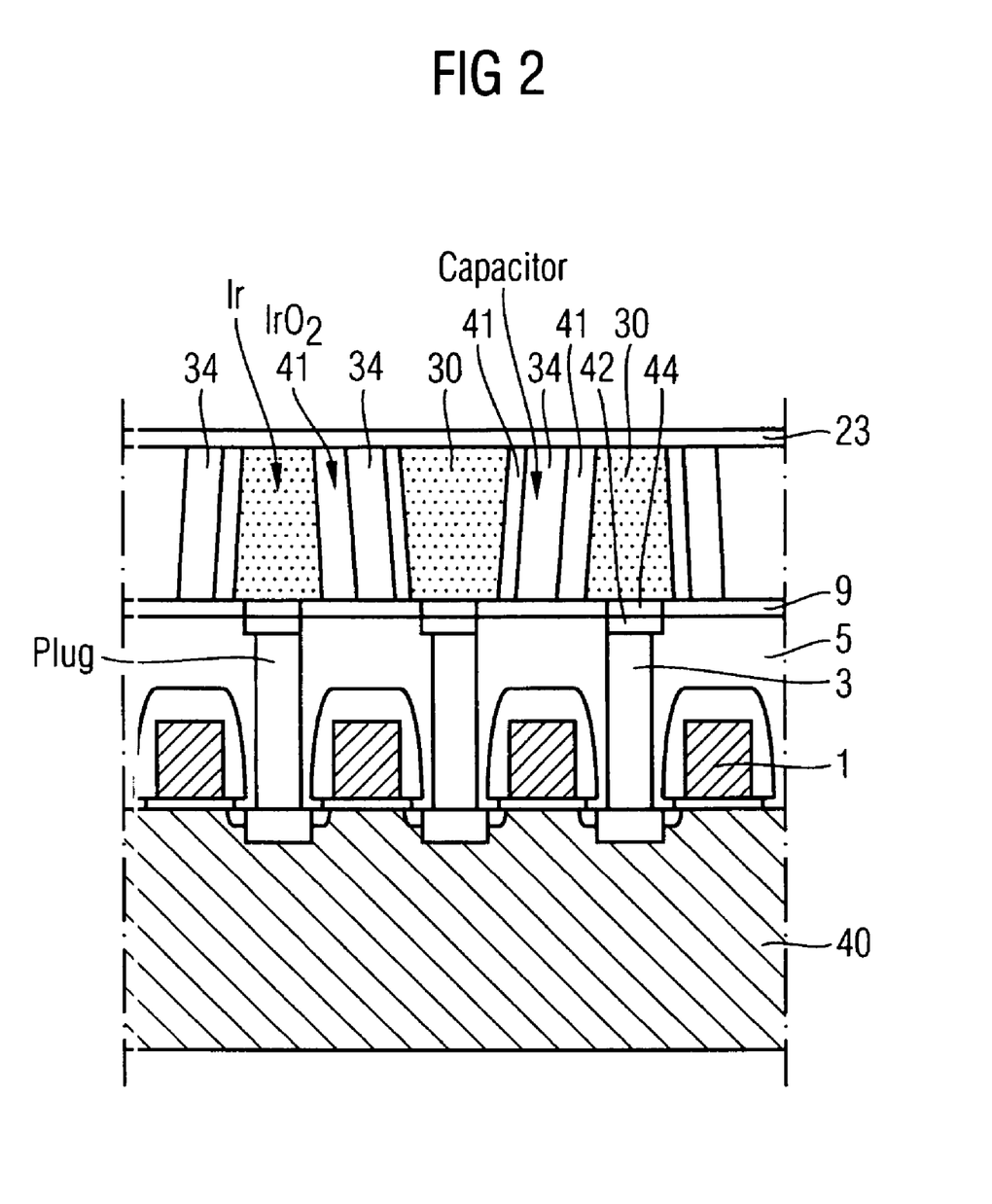
FIG. 2 is a schematic cross-section through a vertical capacitor according to an embodiment of the invention.

FIG. 2 shows a vertical capacitor structure embodying the present invention. The substrate 40 carrying the components 1 and the plugs 3 is covered by a matrix 5, that is, a layer of interlayer dielectric material, such as TEOS, the plugs 3 projecting through the matrix 5. The matrix 5 is covered with an insulating layer 9, of, for example aluminium oxide, and which serves as an oxygen barrier layer, and a further layer 23 of aluminium oxide covers the entire upper surface of the vertical capacitor structure. Inbetween the two insulating layers 9, 23 are positioned the electrodes 30 which are extensions of the plugs 3. The electrodes 30 may be formed of, for example, iridium or iridium oxide. If iridium is used, a layer 41 of iridium oxide is formed around the electrodes 30.

Located between the electrodes 30 are vertical layers 34 of ferroelectric material, such as PZT. The layers 34 of ferroelectric material and the two adjacent electrodes 30 form capacitors.

Figure 3:
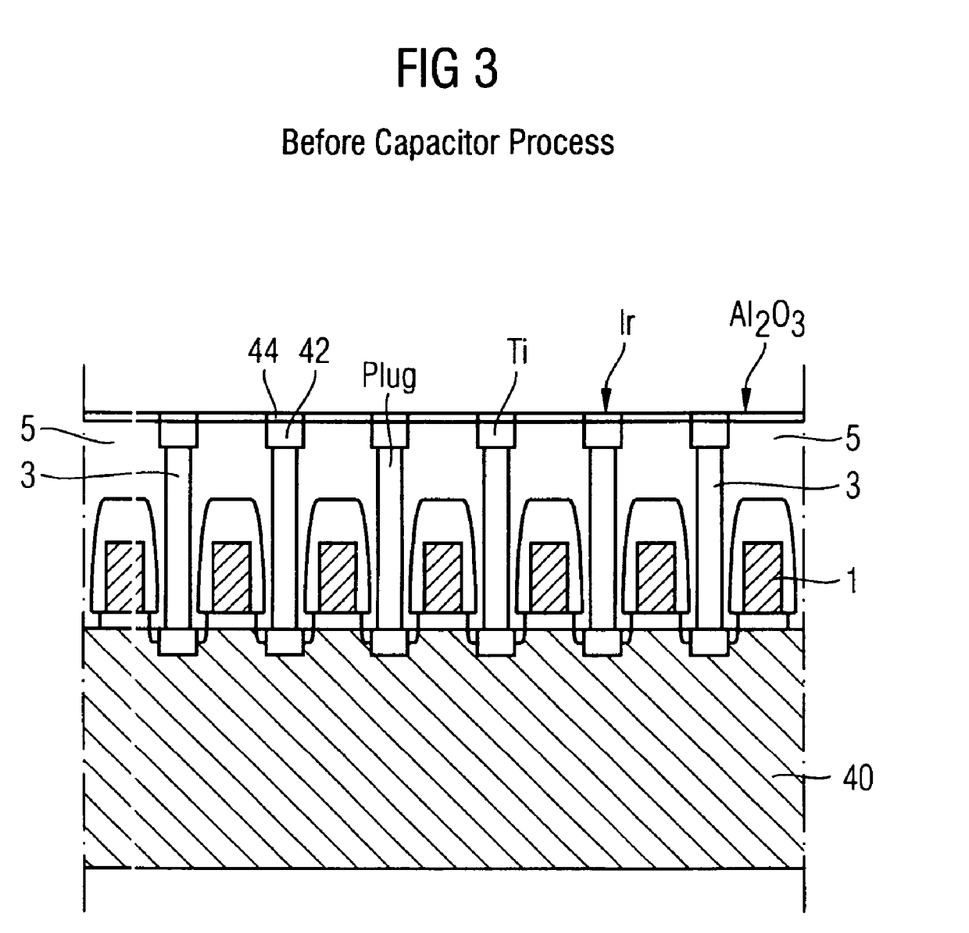
FIG. 3 is a schematic cross-section through a device showing the first stage of construction of a device embodying the invention.

FIG. 3 shows the first stage in the production process of the device shown in FIG. 2. As mentioned above, the device comprises a substrate 40 carrying the control components 1. The matrix 5 of insulating material is formed over the substrate 40 and the plugs 3 extend through the matrix 5 to the insulating layer 9 deposited on the upper surface of the matrix 5. The plugs 3 are capped with a layer 42 of, for example, titanium which is then covered by a layer 44 of, for example, iridium to provide good electrical contacts.

Figure 4:
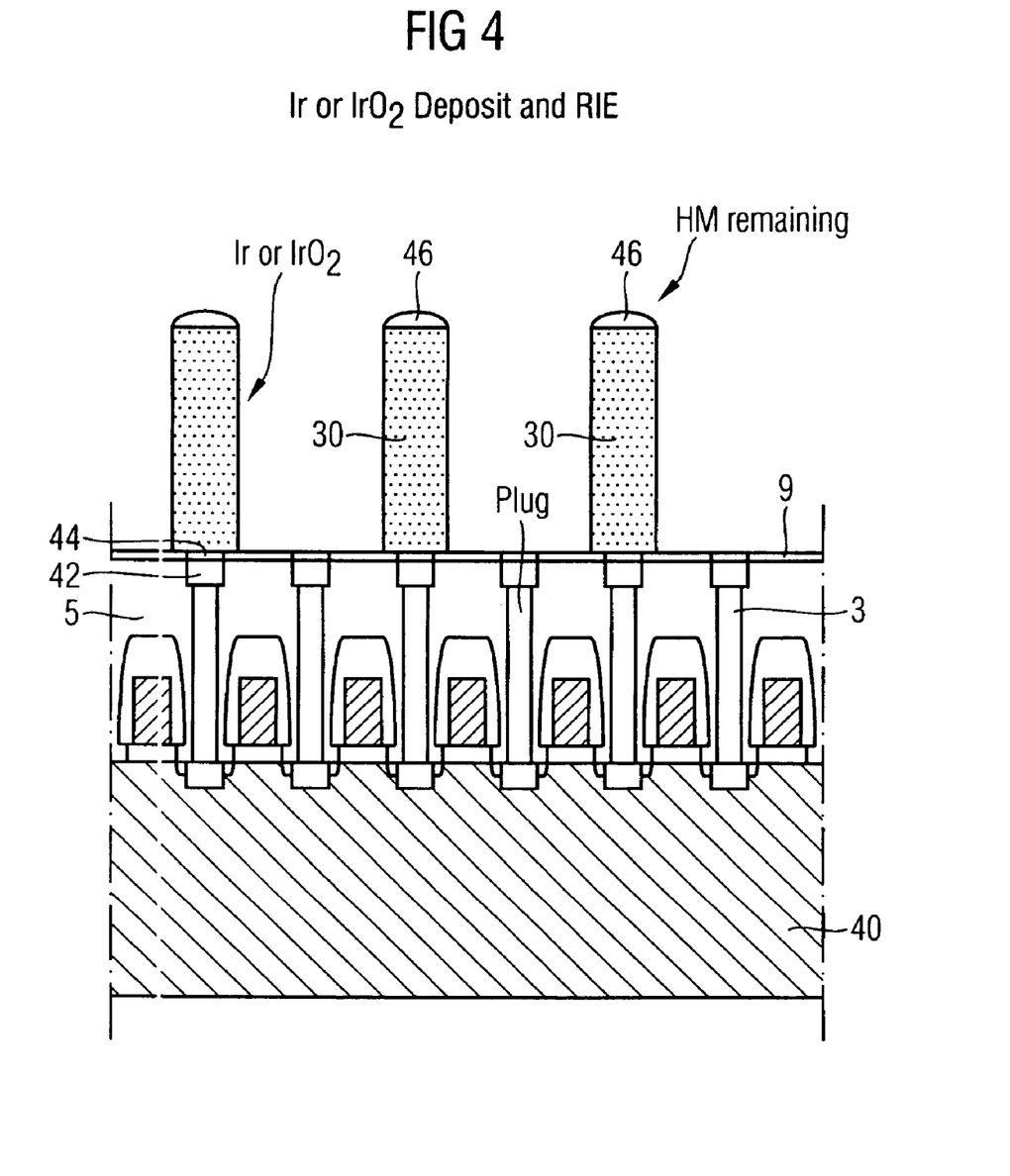
FIG. 4 is a schematic cross-section through a device showing the second stage of construction of a device embodying the invention.

FIG. 4 shows the next stage in the production process. A layer of, for example, iridium or iridium oxide has been deposited on top of the insulating layer 9 and covered with a layer 46 of hard mask material. A photoresist layer (not shown) has been deposited on the hard mask material layer 46 and the photoresist layer has been exposed and developed to form a mask pattern for the hard mask. The layer of for, example, iridium or iridium oxide has been etched according to the mask down to the insulating layer 9 to leave electrodes 30 on alternate plugs 3.

Figure 5:
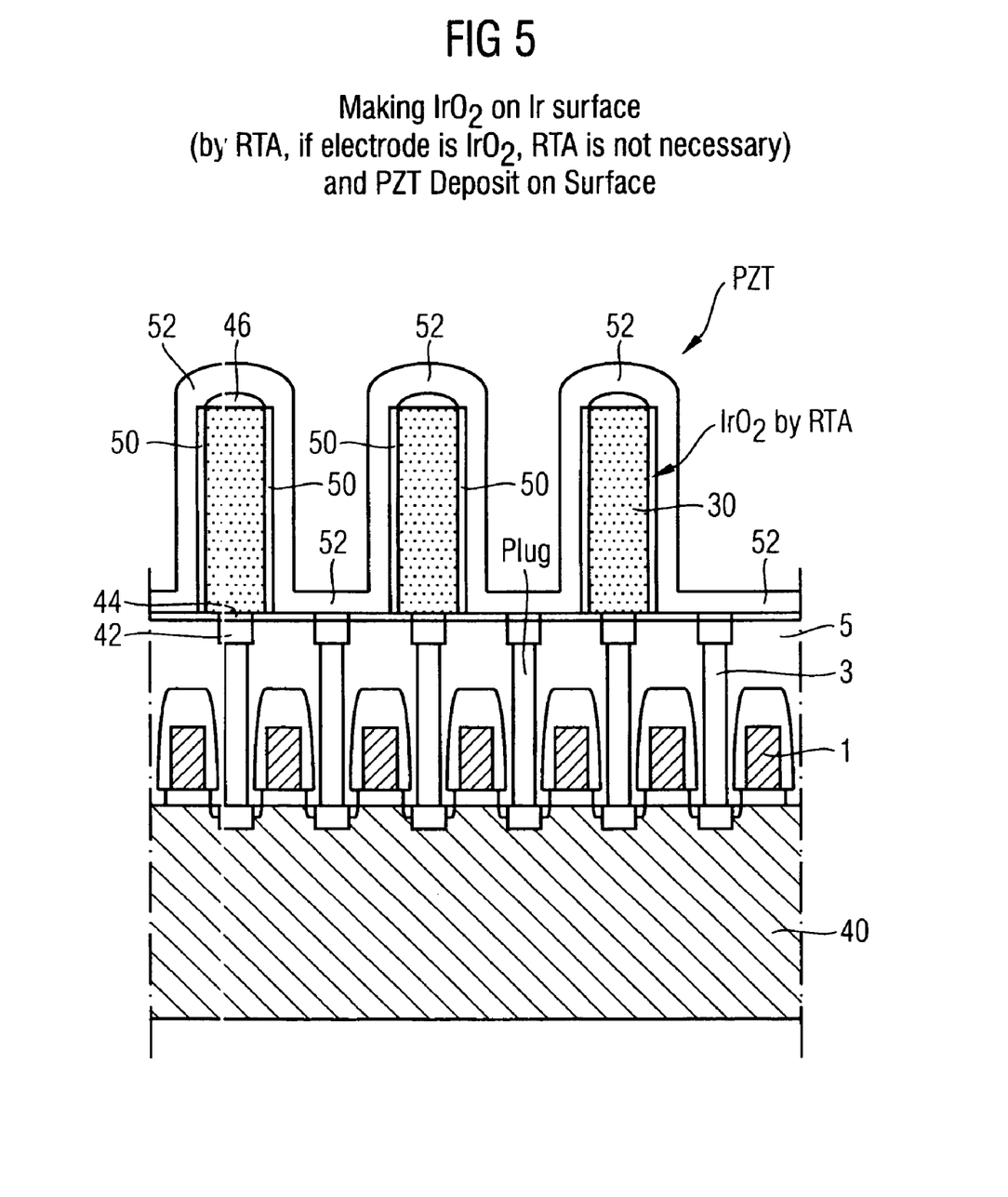
FIG. 5 is a schematic cross-section through a device showing the third stage of construction of a device embodying the invention.

FIG. 5 shows the surface of the electrodes having been oxidised by a rapid thermal annealing (RTA) process to form a coating 50 of, for example iridium oxide if the electrode material is iridium. If iridium oxide is used for the electrodes 30, then this RTA step is not necessary. The coating 50 and the electrodes 30 are then coated with a layer 52 of, for example, PZT. Iridium oxide will improve the crystallinity of the PZT material.

Figure 6:
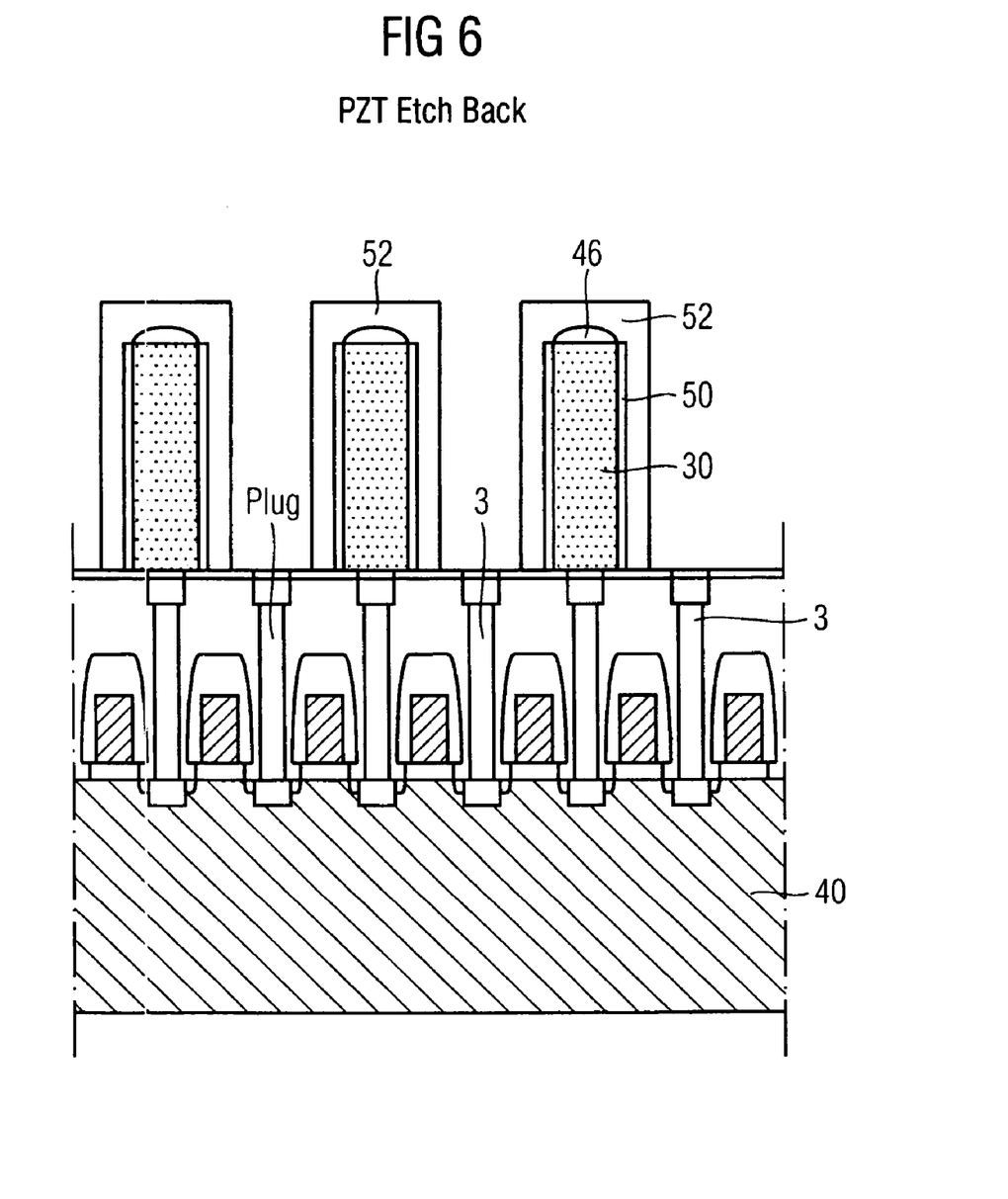
FIG. 6 is a schematic cross-section through a device showing the fourth stage of construction of a device embodying the invention.

FIG. 6 shows the next stage in the process in which the layer 52 of, for example, PZT is etched back to expose the intermediate plugs 3 which are not connected to the electrodes 30.

Figure 7:
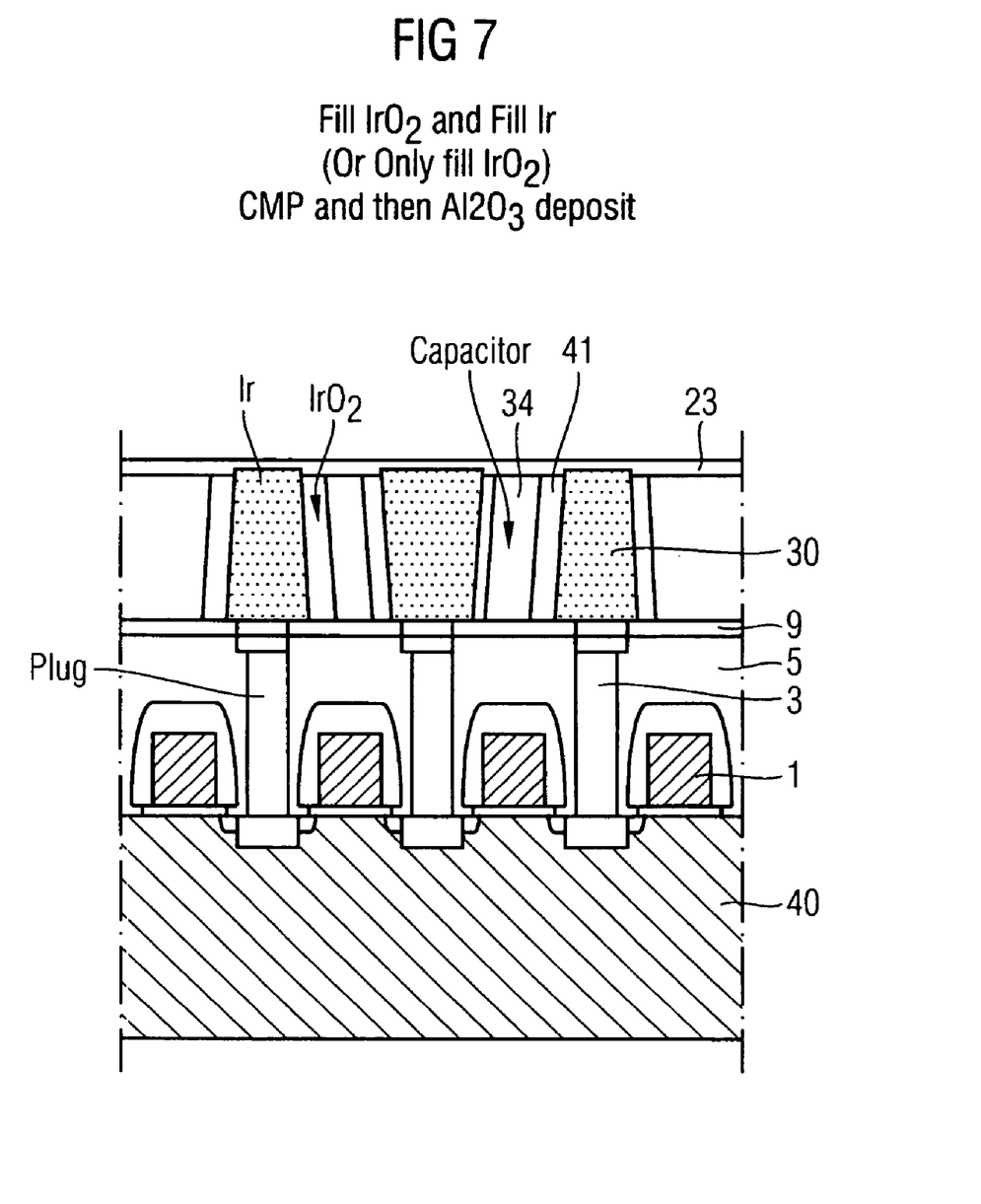
FIG. 7 is a schematic cross-section through a device showing the eighth stage of construction of a device embodying the invention.

In the final stage shown in FIG. 7, the spaces between the outer coatings 52 of adjacent electrodes 30 have either been lined with iridium oxide and filled with iridium, or simply filled with iridium oxide to establish electrical contact with the remaining plugs. The outer surface of the device is then chemically mechanically polished to remove the layer 52 and hard mask residue from the tops of the electrodes 30. A layer 23 of, for example aluminium oxide, is then deposited over the polished surface. Thus the pillars 30 form the electrodes and the layer 52 the dielectric of the capacitors.

As the initial electrodes 30 were tapered by the etching process due to side etching, that is etching along the hard mask rather than through the hard mask, and a uniform layer 34 of ferroelectric material such as PZT was deposited over them, the ferroelectric layer 34 will be of substantially equal thickness along the side faces of the electrodes 30. This is in contrast to conventional devices, such as that shown in FIG. 1, in which the ferroelectric layers 11 taper along the length of the electrodes 19. Thus, in the embodiments illustrated in FIGS. 2 and 7, the electrical stresses on the ferroelectric layer 34 are uniform instead of varying along its length. Adjacent electrodes 30 taper in opposite directions and the sides of adjacent electrodes are therefore substantially parallel. This thereby enables compensation to be obtained for the offset of these sides from the vertical in that the strips of the ferroelectric layer 34 have substantially uniform thickness along their length. The strips of ferroelectric material 34 on opposite sides of the electrodes on which they were deposited slope in opposite directions. However, alternate strips will slope in the same direction and the angle of tilt from the vertical will be approximately between 0.1 to 10 degrees.

As the intermediate electrodes are formed after the etching process, the space between electrodes that are etched is double that in a conventional capacitor devices. This larger aperture will become very important in attempts to reduce cell sizes, for example in FEOL technologies.

The systems and methods according to the present invention may be particularly useful in the production of devices for use, for example, as ferroelectric random access memories.

Various modifications to the embodiments of the present invention described above may be made. For example, other materials and method steps can be added or substituted for those above. Thus, although the invention has been described above using particular embodiments, many variations are possible within the scope of the claims, as will be clear to the skilled reader, without departing from the spirit and scope of the invention.

The invention claimed is:

1. A method for forming a vertical capacitor device comprising the steps of:
   forming a substrate;
   forming a first interlayer dielectric layer on said substrate;
   forming two or more contact plugs through said dielectric layer, said plugs being separated from one another by a surface;
   forming a conducting layer on said first interlayer dielectric layer;
   producing an electrodes on alternate ones of said two or more contact plugs by etching said conducting layer;
   coating said electrodes with a ferroelectric layer;

etching said ferroelectric layer from said surfaces separating said contact plugs; and creating additional electrodes by filling spaces between said electrodes on alternate ones of said contact plugs with a conductive material to establish electrical contact between the plugs and the electrodes.

2. A method according to claim 1, wherein the step of forming said first interlayer dielectric layer comprises forming said first interlayer dielectric layer of TEOS.

3. A method according to claim 1, wherein the step of forming said first interlayer dielectric layer comprises forming said first interlayer dielectric layer of silicon dioxide.

4. A method according to claim 1, wherein the step of forming a conducting layer on said first interlayer dielectric layer comprises forming said conducting layer of iridium.

5. A method according to claim 1, wherein the step of forming a conducting layer on said first interlayer dielectric layer comprises forming said conducting layer of iridium oxide.

6. A method according to claim 1, wherein the step of etching said ferroelectric layer from said surfaces separating said contact plugs comprises the step of applying a layer of hard mask material to said conducting layer, applying a photolithographic layer to said layer of hard mask material, exposing said photolithographic layer, and developing said exposed photolithographic layer to produce an etch pattern for said conducting layer and said hard mask layer.

7. A method according to claim 1, wherein the step of coating said electrodes with a ferroelectric layer comprises coating said electrodes with PZT.

8. A method according to claim 1, wherein the step of filling spaces between said electrodes on alternate ones of said contact plugs with a conductive material comprises filling said spaces with iridium.

9. A method according to claim 1, wherein the step of filling spaces between said electrodes on alternate ones of said contact plugs with a conductive material comprises filling said spaces with iridium oxide.

10. A method according to claim 1, further comprising forming a first barrier layer on said first interlayer dielectric layer.

11. A method according to claim 10, wherein the step of forming said first barrier layer comprises forming said barrier layer of a material substantially resistant to oxygen diffusion.

12. A method according to claim 10, wherein the step of forming said first barrier layer comprises forming said barrier layer of aluminium oxide.

13. A method according to claim 1, further comprising applying a chemical mechanical polishing process to exposed surfaces of said electrodes and said ferroelectric layer after the step of creating additional electrodes.

14. A method according to claim 13 comprising forming a second barrier layer extending over said device after the step of applying a chemical mechanical polishing process.

15. A method according to claim 14, wherein the step of forming said second barrier layer comprises forming said barrier layer of a material substantially resistant to oxygen diffusion.

16. A method according to claim 15, wherein the step of forming said second barrier layer comprises forming said barrier layer of aluminium oxide.

17. A method according to claim 1, wherein the step of producing an electrode on alternate ones of said two or more contact plugs by etching said conducting layer comprises etching said electrodes so that adjacent electrodes taper in opposite directions.

18. A method according to claim 17, wherein the step of etching said electrodes so that adjacent electrodes taper in opposite directions comprises etching the sides of adjacent electrodes to be substantially parallel.

19. A method according to claim 1, wherein the step of coating said electrodes with a ferroelectric layer comprises applying a layer of ferroelectric material having substantially uniform thickness along the length of the side faces of the electrodes coated by the ferroelectric layer.

20. A method according to claim 1, wherein the step of coating said electrodes with a ferroelectric layer comprises applying a layer of ferroelectric material such that portions of said ferroelectric layer material deposited on opposite sides of the electrodes on which they are deposited slope in opposite directions.

21. A method according to claim 1, wherein the step of coating said electrodes with a ferroelectric layer comprises applying a layer of ferroelectric material such that alternate portions of said ferroelectric layer material deposited on adjacent electrodes slope in the same direction.

22. A method according to claim 21, wherein the step of coating said electrodes with a ferroelectric layer comprises applying a layer of ferroelectric material such that portions of said ferroelectric layer deposited on opposite sides of the electrodes on which they are deposited slope at an angle of tilt from the vertical of between approximately 0.1 to 10 degrees.

23. An FeRAM device formed according to the method of claim 1.

24. A ferroelectric capacitor device formed according to the method of claim 1.

* * * * *